US007586369B2

United States Patent
Kobayashi et al.

(10) Patent No.: US 7,586,369 B2
(45) Date of Patent: Sep. 8, 2009

(54) PULSE MODULATION TYPE ELECTRIC POWER AMPLIFIER

(75) Inventors: Hitoshi Kobayashi, Osaka (JP); Kenji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 162 days.

(21) Appl. No.: 11/712,230

(22) Filed: Feb. 28, 2007

(65) Prior Publication Data

US 2007/0236286 A1 Oct. 11, 2007

(30) Foreign Application Priority Data

Mar. 1, 2006 (JP) .............. 2006-054559
Apr. 14, 2006 (JP) .............. 2006-112295

(51) Int. Cl.
*H03F 3/38* (2006.01)
(52) U.S. Cl. .............. 330/10; 330/251; 330/207 A; 330/207 P; 330/298
(58) Field of Classification Search ........... 330/10, 330/251, 207 A, 207 P, 298
See application file for complete search history.

(56) References Cited

U.S. PATENT DOCUMENTS 3,931,581 A * 1/1976 Kush et al. ............ 330/10
4,724,396 A * 2/1988 Taylor et al. .......... 330/10
5,973,569 A * 10/1999 Nguyen ............... 330/298
6,229,388 B1 * 5/2001 Nalbant .............. 330/10
6,373,335 B1 * 4/2002 Carver ............... 330/10
6,469,575 B1 * 10/2002 Oki et al. ............ 330/10

FOREIGN PATENT DOCUMENTS

| JP | 5-160649 | 6/1993 |
| JP | 2002-171140 | 6/2002 |
| JP | 2005-203968 | 7/2005 |

* cited by examiner

*Primary Examiner*—Patricia Nguyen
(74) *Attorney, Agent, or Firm*—Hamre, Schumann, Mueller & Larson, P.C.

(57) ABSTRACT

A pulse modulation type electric power amplifier includes a pulse modulator that receives as input a clock and an input signal, and converts the input signal to a pulse train, an output control circuit that receives as input the pulse train output by the pulse modulator, and controls output of the pulse train, an output circuit that performs switching according to the pulse train output by the output control circuit, a comparator that converts an output terminal voltage of the output circuit to a high or a low digital value, and a short-circuit determination circuit that determines whether an output short circuit has occurred based on a state of an output signal of the comparator, and outputs an output prohibition signal to the output control circuit when an output short circuit is detected. The output control circuit controls output of the pulse train when the output prohibition signal is input, so that the output circuit stops the switching operation. An output short-circuit protection circuit can thereby be configured simply with little circuitry, and is thus small, low power, and integrated easily.

12 Claims, 16 Drawing Sheets

PULSE MODULATION TYPE ELECTRIC POWER AMPLIFIER

BACKGROUND OF THE INVENTION

1. Field of the Invention

The present invention relates to realizing protection when the output terminal of a class D audio amplifier short circuits and to preventing failures in the event of clock stoppage with respect to a pulse modulation type electric power amplifier.

2. Description of the Related Art

Class D audio amplifiers that use pulse width modulation (PWM) or delta-sigma modulation have been utilized in recent years. Pulse modulation power amplifiers such as class D amplifiers are energy efficient in comparison to class A or B amplifiers that amplify analog signals, and have been implemented actively in practical applications.

FIG. 14 shows a block diagram of a common pulse modulation type electric power amplifier. This pulse modulation type electric power amplifier basically is constituted of a pulse modulator 1 that receives as input a clock A and an analog input signal B, and an output circuit 3 that performs switching according to a pulse train C output from the pulse modulator 1. An output control circuit 2 composed of a drive circuit, an arithmetic circuit and the like is inserted between the pulse modulator 1 and the output circuit 3 if necessary. The analog input signal B is converted to a pulse train by the pulse modulator 1, and the output circuit 3 performs switching according to the high and low levels of the pulse train. The analog signal recovered by passing the signal from the output circuit 3 through a low pass filter 4 drives a load (speaker) 5.

With class D audio amplifiers, output protection circuitry that prevents current from continuing to flow to an output terminal in the event of an output short circuit has been proposed in order to prevent the failure of speakers or headphones connected to the output terminal or the failure of the class D audio amplifier itself when the output terminal short circuits.

Exemplary protection circuitry disclosed in JP H5-160649A will be described with reference to FIG. 15. With this circuitry, a low pass filter 4 connected to the output terminal is constituted of an inductor and a condenser, and the (mutual) inductor 6 for detecting current is disposed so that a mutual induction effect occurs with the inductor. The current detection inductor 6 is connected to a rectifier 7, and the output of the rectifier 7 is fed to a flip-flop 8 via a low pass filter 4a.

Current flowing to the output terminal is detected by the current detection inductor 6. This current is converted to a voltage by the rectifier 7 and the low pass filter 4a, and input to the flip-flop 8. The output terminal is regarded as having short circuited when this voltage is greater than or equal to a preset voltage. When this happens, an output stop signal is sent from the flip-flop 8, whereby it is possible to protect the load and the output circuit from failure.

JP 2005-203968A discloses a digital amplifier having the protection device shown in FIG. 16. With this circuitry, the voltage at both ends of an inductor constituting a low pass filter 4 connected to the output terminal is input to an amplifier 10. The output of the amplifier 10 is input to a filter circuit 11 that compensates for deviation in the linearity of the impedance and frequency of the inductor. The output of the filter circuit 11 is input to a microcomputer 13 via a detection circuit 12. An output control circuit 2 is configured so that a pulse train C is input to a drive circuit 2b via a gate circuit 2a, with the output of the microcomputer 13 being fed as the other input of the gate circuit 2a. The output of the low pass filter 4 is fed to a load (speaker) 5 via an output relay 9, which is controlled by the microcomputer 13.

The output of the filter circuit 11 forms a detection signal for current flowing through the inductor of the low pass filter 4, and the microcomputer 13 compares the input current detection signal with a preset reference value. When excess current is flowing through the inductor, the current detection signal exceeds the reference value of the microcomputer 13, and the microcomputer 13 determines that an output short circuit has occurred. When this happens, an output short-circuit detection signal is fed by the microcomputer 13, whereby it is possible to protect the load and the output circuit from failure by the gate circuit of the output control circuit 2 and the output relay 9 operating to stop output.

Also, with pulse modulation type electric power amplifiers, electromagnetic interference (EMI) or physical impacts may cause problems with the clock generating means or with the connection from the clock generating means to the pulse modulator, causing stoppage of the clock signal input to the pulse modulator. As a result, the circuit is fixed in a state in which direct current flows from the output terminal to a load such as speakers or headphones. This direct current can cause the load to heat up and thereby physically harm the user as a result of surpassing the allowable current of the load, or cause speakers or headphones connected to the output terminal or the pulse modulation type electric power amplifier itself to fail. To avoid such situations, it is preferable to provide a means for preventing current from continuing to flow to the output terminal.

However, with conventional protection circuitry such as the above, short circuits are detected by detecting the current flowing to the output circuit, which requires various analog circuitry for measuring the voltage or current, such as an analog amplifier, a high-precision comparator for comparison with a reference voltage or current, and an analog filter for averaging the measured voltage or current. Consequently, a drawback is the complexity and high power consumption of the circuitry. Another problem is the time taken from when a short circuit is determined until output control is implemented because of the control being performed after feeding back the signal of the output terminal.

Further, with a configuration such as that described in JP H5-160649A, difficulties are encountered in embedding the circuit into a semiconductor apparatus due to the use of mutual inductance, with problems of increased mounting area and power loss caused by the mutual inductance.

SUMMARY OF THE INVENTION

An object of the present invention is to provide a pulse modulation type electric power amplifier having an output short-circuit protection circuit that can be configured simply with little circuitry, and is therefore small in area, low power consumption and easily integrated.

A further object of the present invention is to provide a pulse modulation type electric power amplifier having a protection circuit capable of realizing output control and protection in a short time period from clock stoppage.

A pulse modulation type electric power amplifier having a first configuration of the present invention includes: a pulse modulator that receives as input a clock and an input signal, and converts the input signal to a pulse train; an output control circuit that receives as input the pulse train output by the pulse modulator, and controls output of the pulse train; an output circuit that performs switching according to the pulse train output by the output control circuit; a comparator that converts an output terminal voltage of the output circuit to a high or a low digital value; and a short-circuit determination circuit that determines whether an output short circuit has occurred based on a state of an output signal of the comparator, and outputs an output prohibition signal to the output control circuit when an output short circuit is detected. The output control circuit controls output of the pulse train when the output prohibition signal is input, so that the output circuit stops the switching operation.

According to a pulse modulation type electric power amplifier having this configuration, it is possible to provide protection in the event of an output short circuit with a digital circuit that easily can be embedded in a semiconductor apparatus, without requiring complicated analog circuitry or mutual inductance for measuring voltage or current. Also, since current does not flow constantly, it is possible to realize a low power consumption.

A pulse modulation type electric power amplifier having a second configuration of the present invention includes: a pulse modulator that receives as input a clock and an input signal, and converts the input signal to a pulse train; an output control circuit that receives as input the pulse train output by the pulse modulator, and controls output of the pulse train; an output circuit that performs switching according to the pulse train output by the output control circuit; and a clock detection circuit that detects stoppage of the clock, and outputs an output prohibition signal to the output control circuit when the clock has stopped. The output control circuit controls output of the pulse train when the output prohibition signal is input, so that the output circuit stops the switching operation.

According to a pulse modulation type electric power amplifier having this configuration, physical harm to the user as well as failure of speakers or headphones connected to the output terminal or failure of the pulse modulation type electric power amplifier itself can be prevented even if clock stoppage occurs. The clock detection circuit can be configured simply with little circuitry, and is therefore small size, low power consumption, and easily integrated. Further, it is possible to realize output control and protection in a short timeframe from clock stoppage because of the feed forward control from the clock.

DETAILED DESCRIPTION OF THE INVENTION

Figure 1:
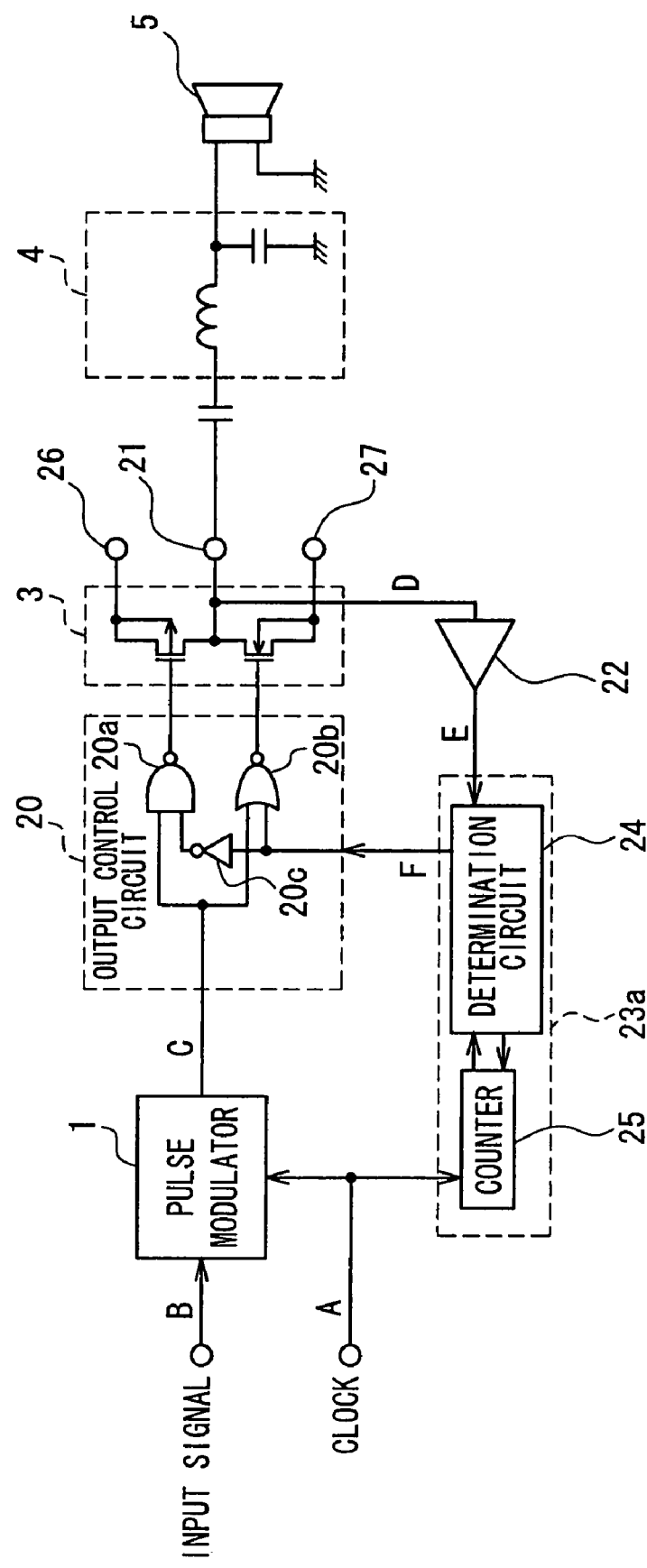
FIG. 1 is a block diagram of a pulse modulation type electric power amplifier according to a first embodiment of the present invention.

Various changes such as the following can be added to the above configuration of the pulse modulation type electric power amplifier of the present invention.

With the pulse modulation type electric power amplifier having the above first configuration, the short-circuit determination circuit preferably determines that a short circuit has occurred if the output signal of the comparator does not change within a set time period.

Also, the short-circuit determination circuit can compare the output signal of the comparator with a signal output from the pulse modulator, and determine that a short circuit has occurred if the output signal of the comparator does not match the signal output from the pulse modulator.

Further, the output circuit can be constituted of a first switching element connected between an output terminal and a power supply terminal and a second switching element connected between the output terminal and a ground terminal, and separately can stop a switching operation of the first switching element and the second switching element according to the output prohibition signal.

Further, the output control circuit can include a first output control circuit that receives as input the output of the short-circuit determination circuit and the output of the pulse modulator, and a second output control circuit that receives as input the output of the short-circuit determination circuit and a signal obtained by inverting the output of the pulse modulator. The output circuit can include a first output circuit constituted of a first switching element connected between a first output terminal and a power supply terminal and a second switching element connected between the first output terminal and a ground terminal, and a second output circuit constituted of a third switching element connected between a second output terminal and the power supply terminal and a fourth switching element connected between the second output terminal and the ground terminal, and constitute a bridge circuit in which the first and second switching element pair and the third and fourth switching element pair are alternately turned ON/OFF to switch a direction of current flowing between the first and second output terminals, as a result of the first and second switching elements performing switching in accordance with a pulse train output from the first output control circuit and the third and fourth switching elements performing switching in accordance with a pulse train output from the second output control circuit. The comparator can include a first comparator that converts a voltage of the first output terminal to a high or a low digital value, and a second comparator that converts a voltage of the second output terminal to a high or a low digital value, and the short-circuit determination circuit can determine whether a short circuit has occurred between the first and second output terminals based on an output signal of the first and second comparators.

Further, the pulse modulation type electric power amplifier preferably further includes a detector that detects that the output of the first comparator and the output of the second comparator are not inverted signals, and the short-circuit determination circuit preferably determines that the first and second output terminals have short circuited if the detector continuously detects the non-inverted signal state for a set time period or longer.

Further, the set time period used by the short-circuit determination circuit for determining whether a short circuit has occurred can be measured based on the clock.

Further, the comparator can be constituted of an inverter. In this case, the inverter can be a hysteresis inverter whose threshold differs when changing from high to low and from low to high.

Further, the pulse modulator can output one of a pulse width modulated pulse train, a pulse density modulated pulse train, and a delta-sigma modulated pulse train. In this case, a signal output from the output circuit is an audio signal.

In the pulse modulation type electric power amplifier having the second configuration, the clock detection circuit can include an inverter that receives as input the clock, an integrator that receives as input an output of the inverter, and a comparator that detects whether an output of the integrator is within a normal range through comparison with a prescribed reference value, and output the output prohibition signal when the comparator detects that the output of the integrator is outside the normal range.

Also, the clock detection circuit can include a frequency divider that receives as input the clock, an integrator that receives as input an output of the frequency divider, and a comparator that detects whether an output of the integrator is within a normal range through comparison with a prescribed reference value, and output the output prohibition signal when the comparator detects that the output of the integrator is outside the normal range.

The integrator can be constituted of a low pass filter.

Also, the output control circuit can include a first output control circuit that receives as input the output of the clock detection circuit and the output of the pulse modulator, and a second output control circuit that receives as input the output of the clock detection circuit and a signal obtained by inverting the output of the pulse modulator, the output circuit can include a first output circuit that receives as input an output of the first output control circuit and a second output circuit that receives as input an output of the second output control circuit, with the outputs of the first and second output circuits being differential.

Further, the pulse modulator can output one of a pulse width modulated pulse train, a pulse density modulated pulse train, and a delta-sigma modulated pulse train. In this case, a signal output from the output circuit can be an audio signal.

A pulse modulation type electric power amplifier according to the embodiments of the present invention will be described below with reference to the drawing.

FIRST EMBODIMENT

Figure 14:
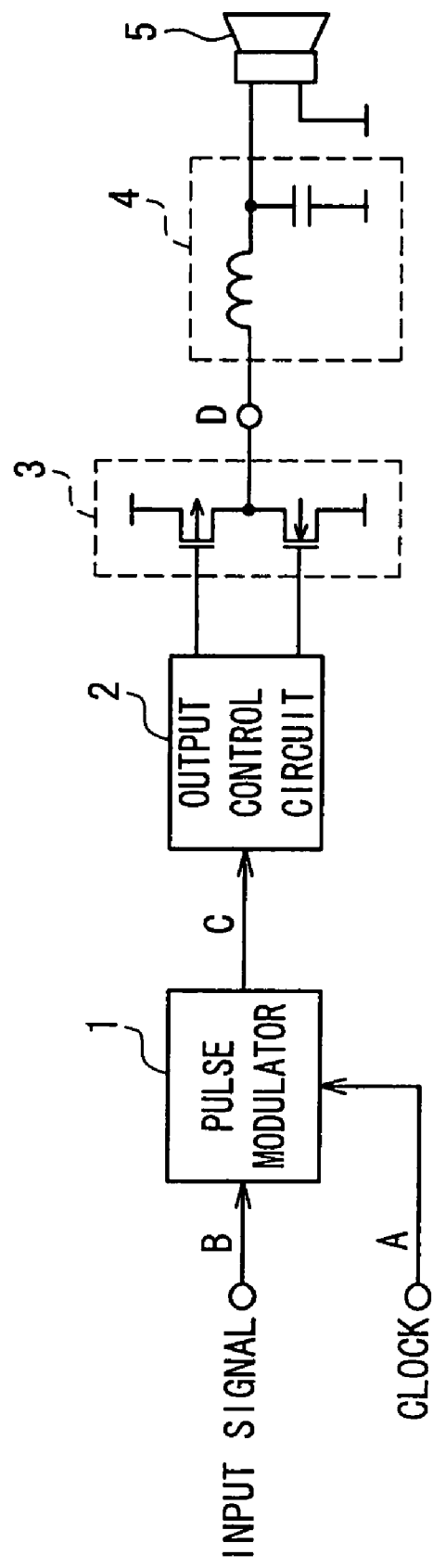
FIG. 14 is a block diagram of a conventional common pulse modulation type electric power amplifier.
Figure 15:
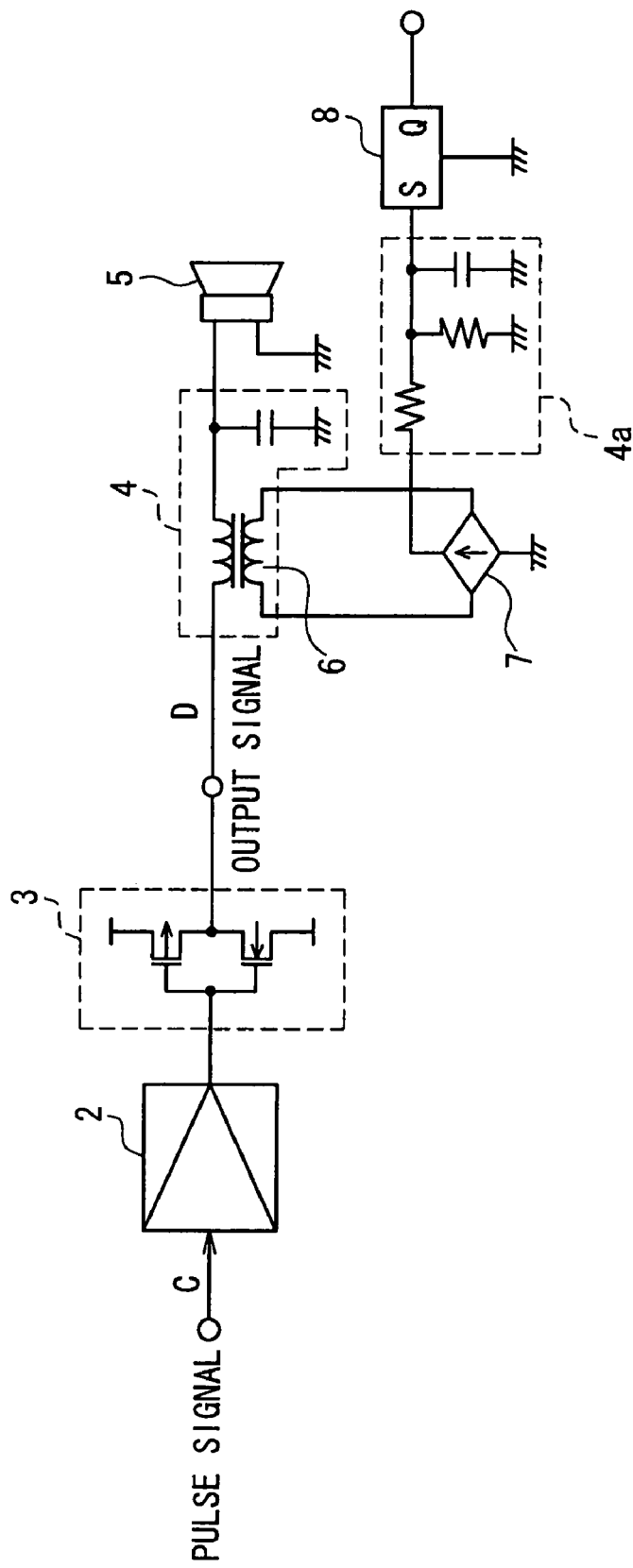
FIG. 15 is a block diagram of conventional audio output protection circuitry.
Figure 16:
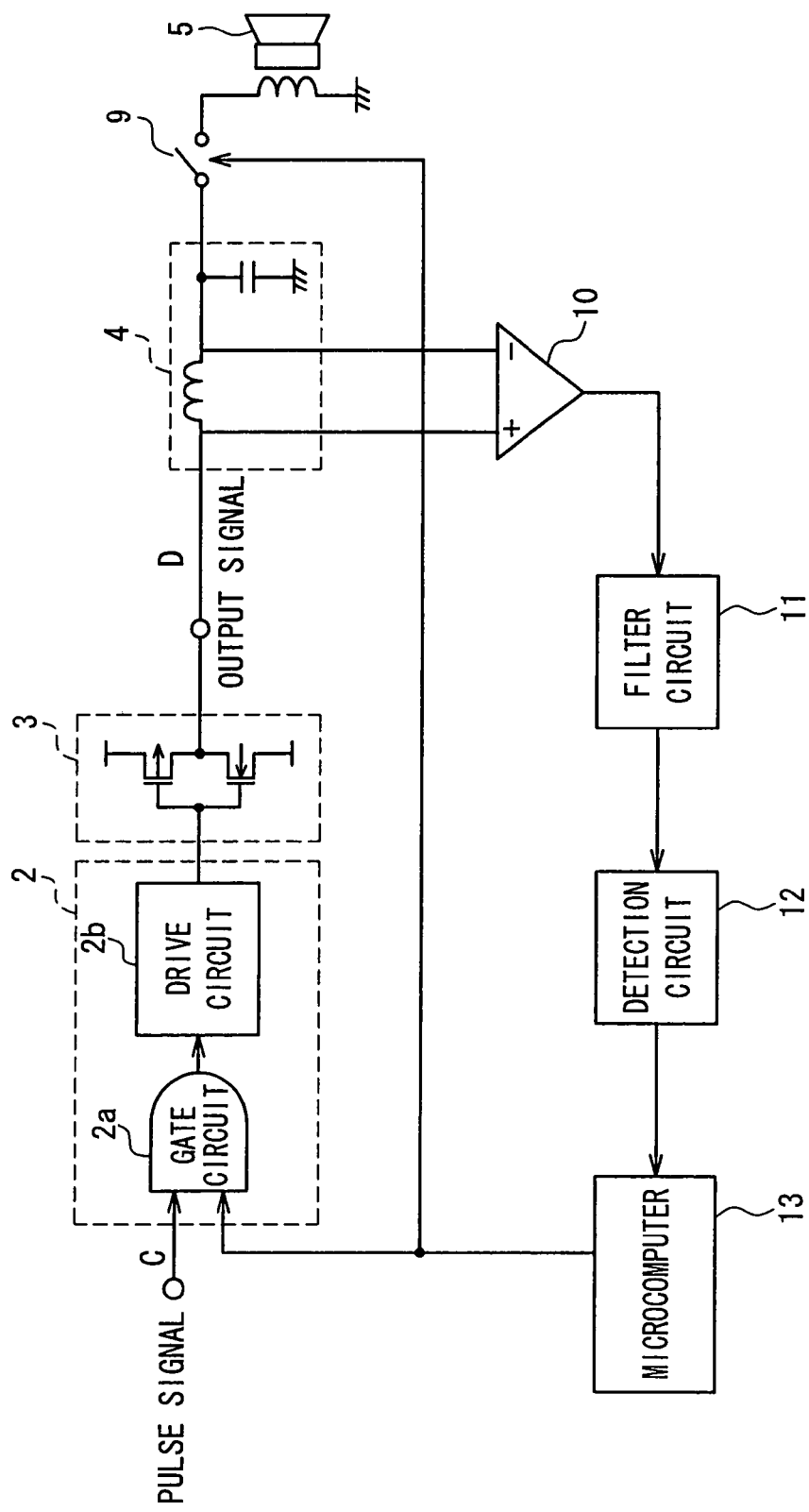
FIG. 16 is a block diagram of a conventional protection device for a digital amplifier.

FIG. 1 is a block diagram showing a pulse modulation type electric power amplifier according to a first embodiment of the present invention. The basic configuration of this circuit is similar to that shown in FIG. 14. The same reference numeral will be attached to like elements, and redundant description will be partly omitted.

This pulse modulation type electric power amplifier is basically constituted of a pulse modulator 1 that receives as input a clock A and an analog input signal B, an output control circuit 20 that receives as input an output signal C of the pulse modulator 1 and is configured to be able to stop a switching operation, and an output circuit 3 that performs switching according to the output of the output control circuit 20. Further, a comparator 22 that is connected to an output terminal 21 of the output circuit 3 and a short-circuit determination circuit 23a that is fed with the output of the comparator 22 are provided to constitute protection circuitry. The comparator 22 converts a voltage D of the output terminal 21 to a high or a low digital value E, and the short-circuit determination circuit 23a determines whether a short circuit has occurred based on the state of the signal output from the comparator 22.

The output control circuit 20 includes a NAND circuit 20a and a NOR circuit 20b, with the pulse modulator output C being fed as one the inputs of the circuits 20a and 20b. An output prohibition signal F from the short-circuit determination circuit 23a is fed as the other input of the NOR circuit 20b. A signal obtained by passing the output prohibition signal F through an inverter circuit 20c is fed as the other input of the NAND circuit 20a. The result of the logic operations performed by the NAND circuit 20a and the NOR circuit 20b is output as a pulse train.

The short-circuit determination circuit 23a has a determination circuit 24 that receives as input the output E of the comparator 22, and a counter 25 that receives as input the clock A. The determination circuit 24 uses the counter 25 to measure the time period that the output E of the comparator 22 is fixed at high or low, and outputs the output prohibition signal F to the output control circuit 20 if the output E of the comparator 22 is fixed at high or low for longer than a set time period.

The output circuit 3 is constituted of a PMOS transistor and a NMOS transistor that are connected respectively to a power supply terminal 26 and a ground terminal 27, with the connection point of both transistors being connected to the output terminal 21.

Figure 2:
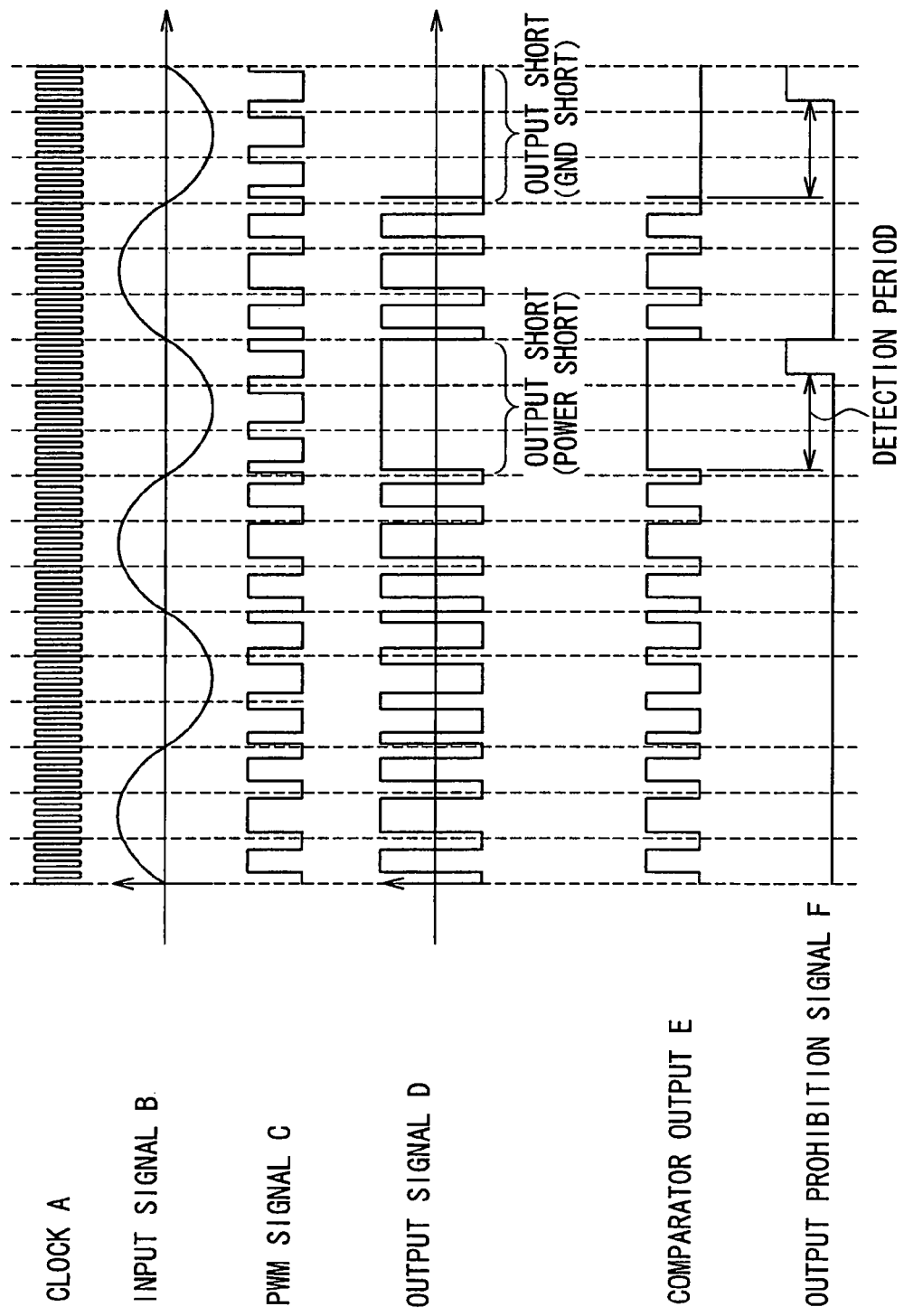
FIG. 2 is a signal waveform diagram showing the operation of the pulse modulation type electric power amplifier according to the first embodiment.

The operation of the pulse modulation type electric power amplifier configured as described above is shown in FIG. 2. A to F are the waveforms of the corresponding signals in FIG. 1. The pulse modulator 1 converts the input signal B to a pulse-width modulated (PWM) signal C in accordance with the clock A. The PWM signal C is fed to the output circuit 3 via the output control circuit 20. The output circuit 3 outputs the output signal D to drive a speaker 5, which is a load, with the PMOS transistor being ON and the NMOS transistor being OFF when the PWM signal C output from the pulse modulator 1 is high, and the PMOS transistor being OFF and the NMOS transistor being ON when the PWM signal C is low.

The comparator 22 outputs the comparator output E, which is a signal of the same state as the output terminal 21. The normal PWM signal C continually changes from high to low and from low to high, with neither the low nor the high state continuing for longer than the PWM modulation cycle. However, if the output terminal 21 shorts to the power supply terminal 26 or the ground terminal 27 as a result of solder defects during mounting or external contact on the terminal, the voltage of the output terminal 21 is not able to swing fully to the potential of the power supply terminal 26 or the ground terminal 27, resulting in the comparator output E remaining fixed at high or low.

The determination circuit 24 outputs the output prohibition signal F to the output control circuit 20 if the comparator output E remains fixed at high or low for longer than a set time period. The output control circuit 20 thereby stops power amplification by turning OFF the transistors of the output circuit 3. That is, the logic operation performed by the output control circuit 20 is changed by the output prohibition signal F, with a high voltage being input to the PMOS transistor of the output circuit 3 and a low voltage being input to the NMOS transistor. Consequently, the PMOS transistor and the NMOS transistor are turned OFF.

Note that the short-circuit determination circuit 23a measures the time period for which the comparator output E remains fixed at high or low using the counter 25 in order to determine whether an output short circuit has occurred, so as to avoid mistakenly determining that a short circuit has occurred during normal operation. Also, the comparator 22 may be constituted of an inverter, and with the pulse modulation type electric power amplifier of the present invention, the short-circuit protection circuit may be constituted of a digital circuit. As for the inverter, a hysteresis inverter whose threshold differs when changing from high to low and from low to high may also be used.

SECOND EMBODIMENT

Figure 3:
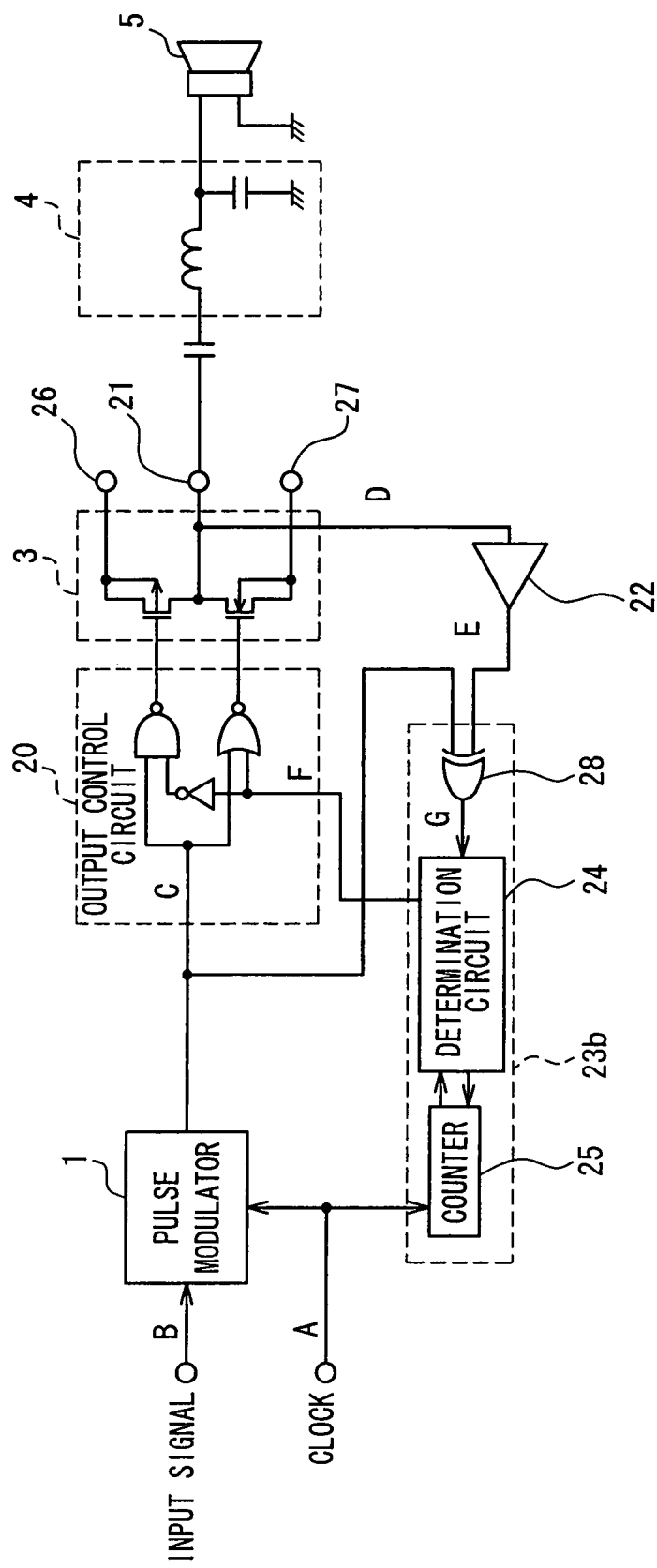
FIG. 3 is a block diagram of a pulse modulation type electric power amplifier according to a second embodiment of the present invention.

FIG. 3 is a block diagram showing a pulse modulation type electric power amplifier according to a second embodiment of the present invention. This circuit has a configuration in which a short-circuit determination circuit 23b is provided in place of the short-circuit determination circuit 23a in FIG. 1. The short-circuit determination circuit 23b has an EXOR gate 28, with the output E of the comparator 22 being fed as one of the inputs of the EXOR gate 28. The PWM output signal C output from the pulse modulator 1 is fed as the other input of the EXOR gate 28. An output signal G of the EXOR gate 28 is input to the determination circuit 24.

Figure 4:
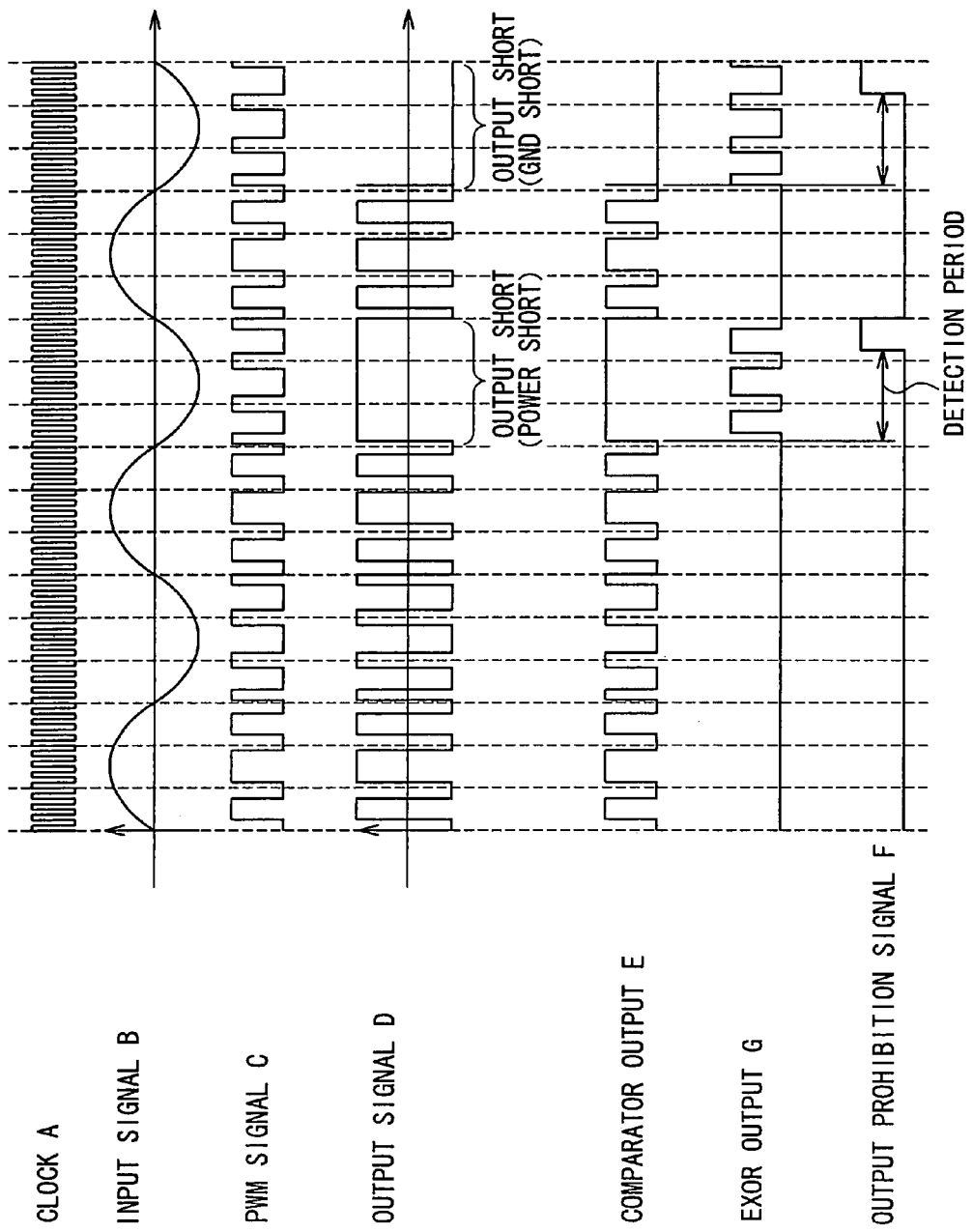
FIG. 4 is a signal waveform diagram showing the operation of the pulse modulation type electric power amplifier according to the second embodiment.

The operation of this pulse modulation type electric power amplifier is shown in FIG. 4. A to G are the waveforms of the corresponding signals in FIG. 3. The basic operation is similar to the operation of the circuitry in FIG. 1 described with reference to FIG. 2. A difference lies in the operation of the short-circuit determination circuit 23b. The short-circuit determination circuit 23b detects if the output signal E of the comparator 22 continues to differ from the PWM output signal C of the pulse modulator 1 for longer than a set time period, based on the signal G obtained through a comparison of the PWM output signal C with the output signal E. If this is the case, the short-circuit determination circuit 23b determines that a short circuit has occurred, and outputs the output prohibition signal F to the output control circuit 20 to turn OFF the transistors of the output circuit 3 and stop power amplification.

Note that where the signal of the comparator 22 is fixed at high or low when an output short circuit has occurred, the output signal E of the comparator 22 matches either the high level or the low level of the PWM output signal C of the pulse modulator 1. Consequently, the EXOR signal between the output signals C and E has a pulse shape such as the EXOR signal G in FIG. 4. Similarly, a very narrow "spiky" pulse is output from the EXOR gate 28 even under normal operating conditions because of the phase lag between the PWM output signal C of the pulse modulator 1 and the output signal E of the comparator 22 due to the delay time. Consequently, the determination circuit 24 measures the width of the pulse output from the EXOR gate 28 to determine whether the same signal as the PWM output signal C of the pulse modulator 1 is being output from the output terminal 21.

Note that although the circuitry in FIG. 3 uses the EXOR gate 28 in order to compare the output signal E of the comparator 22 with the PWM output signal C of the pulse modulator 1, alternative methods also can be used.

THIRD EMBODIMENT

Figure 5:
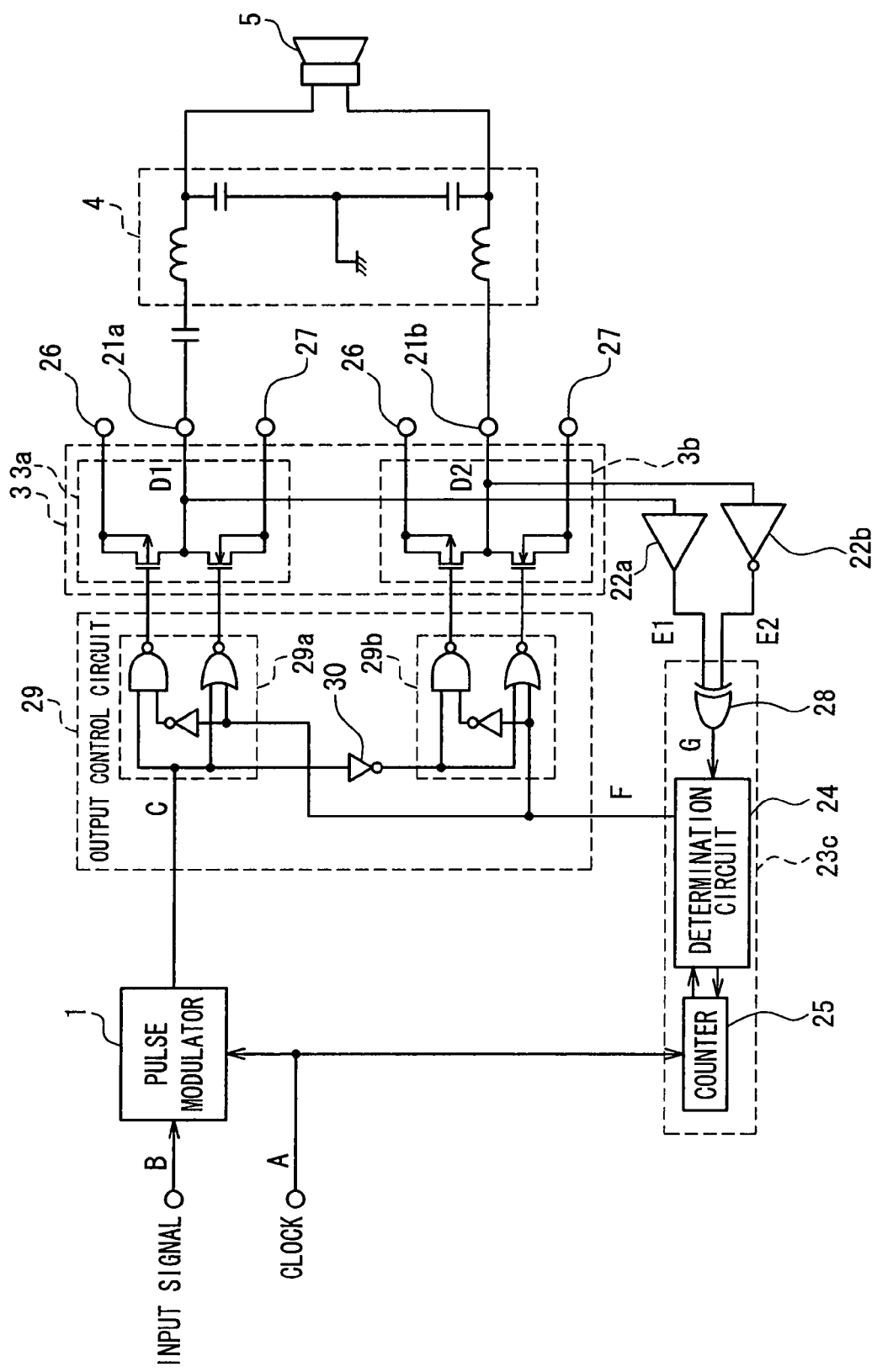
FIG. 5 is a block diagram of a pulse modulation type electric power amplifier according to a third embodiment of the present invention.

FIG. 5 is a block diagram showing a pulse modulation type electric power amplifier according to a third embodiment of the present invention. The present embodiment relates to a configuration for detecting short circuits between the output terminals of a bridged transformerless (BTL) pulse modulation type electric power amplifier.

With the circuit in FIG. 5, the output circuit 3 is composed of a first and a second output circuit 3a and 3b having a bridge configuration. PMOS transistor and NMOS transistor pairs of the first and second output circuits 3a and 3b are connected between the power supply terminal 26 and the ground terminal 27, and the connection points of the pairs respectively are connected to a first and a second output terminal 21a and 21b. The output of the first output circuit 3a is differential to the output of the second output circuit 3b.

An output control circuit 29 has a configuration in which a first and a second output control circuit 29a and 29b respectively are connected to the output circuits 3a and 3b, similarly to the output control circuit 20 of the circuit in FIG. 1. The pulse modulator output C is fed to the second output control circuit 29b after being inverted by the inverter circuit 30.

Output signals D1 and D2 of the first and second output terminals 21a and 21b respectively are fed to a first and a second comparator 22a and 22b, whose output E1 and E2 is input to a short-circuit determination circuit 23c.

Figure 6:
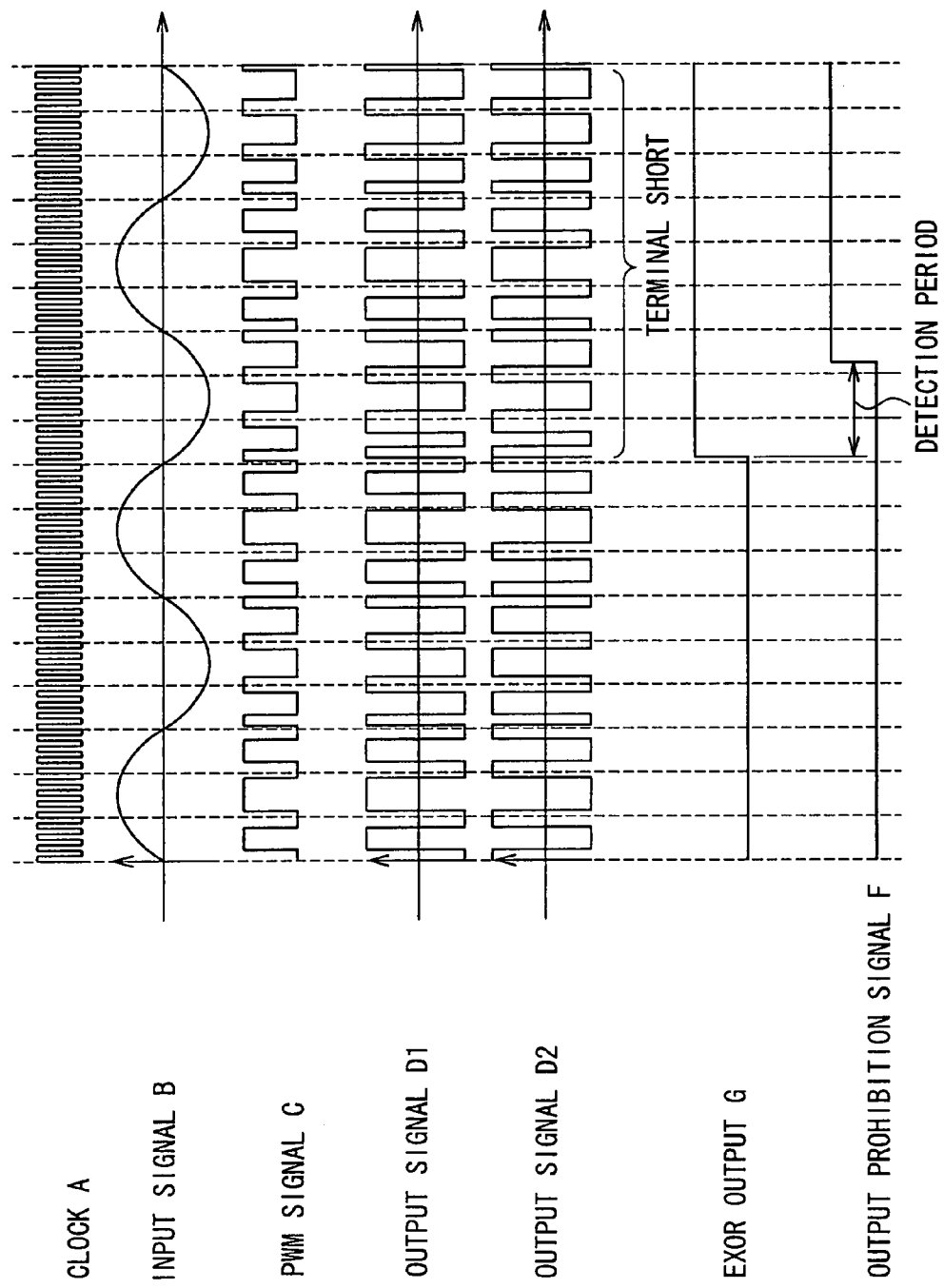
FIG. 6 is a signal waveform diagram showing the operation of the pulse modulation type electric power amplifier according to the third embodiment.

The operation of this pulse modulation type electric power amplifier is shown in FIG. 6. A to C, D1, D2, F and G are the waveforms of the corresponding signals in FIG. 5. The basic operation is similar to the operation of the circuitry in FIG. 1 described with reference to FIG. 2.

With a BTL pulse modulation type electric power amplifier, it is possible for the output signals D1 and D2 to drive a load such as a speaker by operating in inverse phase. Under normal operating conditions with a BTL pulse modulation type electric power amplifier, the first and second output terminals 21a and 21b continue to operate in inverse phase.

However, if shorted, the first and second output terminals 21a and 21b operate in phase. In terms of the output signals D1 and D2 output from the first and second output terminals 21a and 21b, the short-circuit determination circuit 23a determines that a short-circuit has occurred between the terminals if the signals E1 and E2 output from the comparators 22a and 22b continue operating in phase for a set time period or longer. As a result, it is possible for the short-circuit determination circuit 23c to prevent failure of a load such as a speaker or the pulse modulation type electric power amplifier itself by outputting the output prohibition signal F to turn OFF the output circuits 3a and 3b.

Note that with a BTL pulse modulation type electric power amplifier, it is also possible to realize protection by detecting both short circuits to the power supply and ground and short circuits between output terminals by combining the functions of the third embodiment in a determination circuit together with the first or second embodiment.

FOURTH EMBODIMENT

Figure 7:
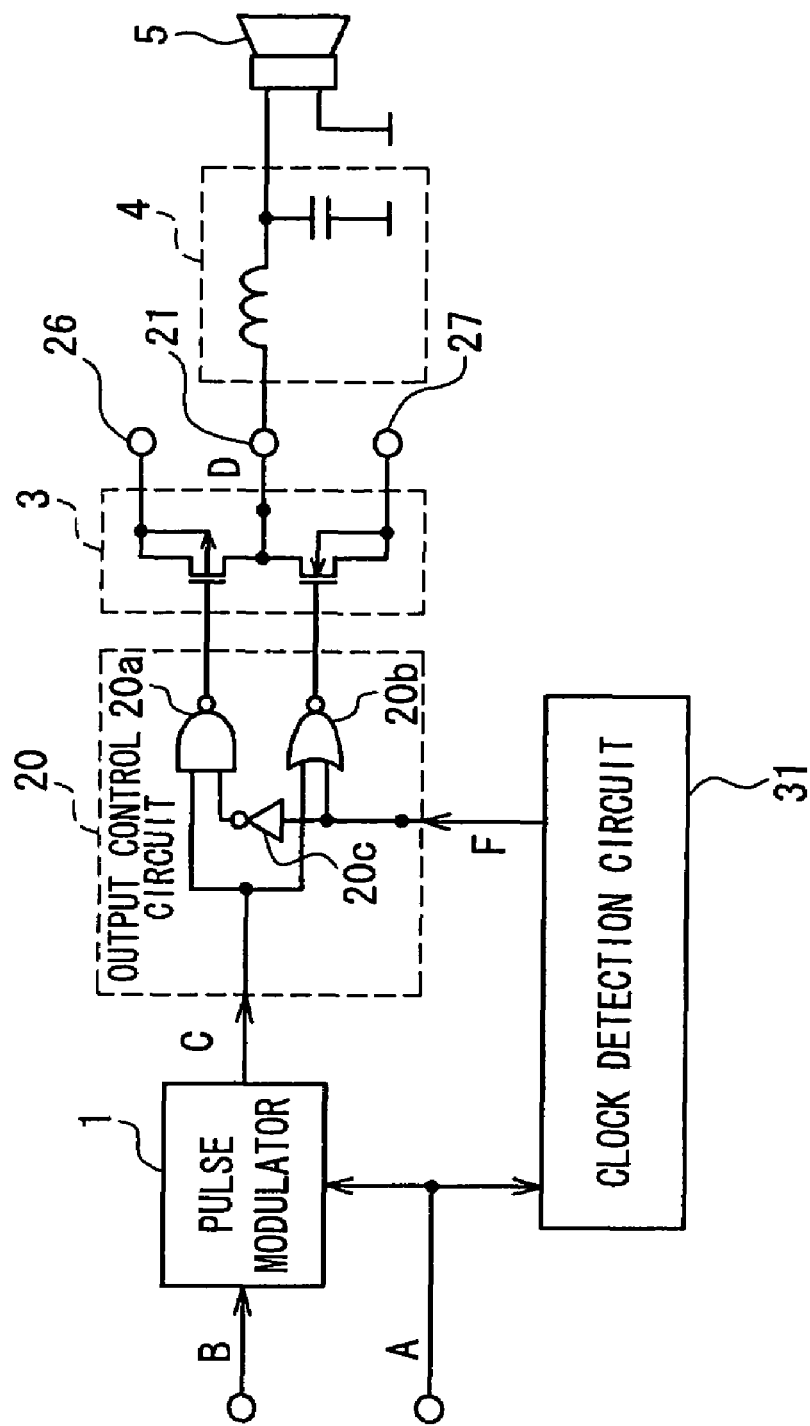
FIG. 7 is a block diagram of a pulse modulation type electric power amplifier according to a fourth embodiment of the present invention.

FIG. 7 is a block diagram of a single output pulse modulation type electric power amplifier according to a fourth embodiment of the present invention. This pulse modulation type electric power amplifier includes a clock detection circuit 31 in place of the comparator 22 and the short-circuit determination circuit 23a of the pulse modulation type electric power amplifier according to the first embodiment shown in FIG. 1. The clock detection circuit 31 receives as input the clock A, detects stoppage of the clock A, and generates the output prohibition signal F in the event of clock stoppage.

Figure 8:
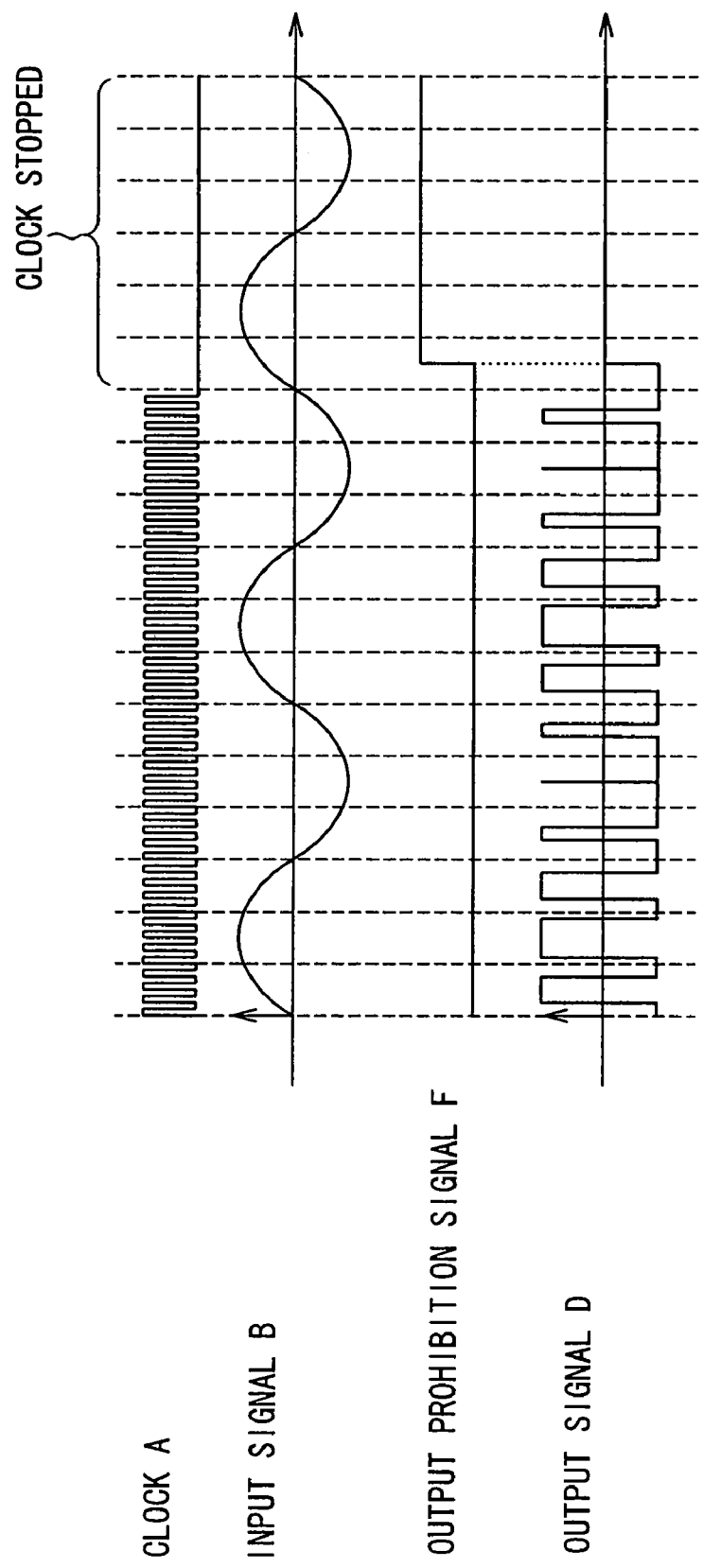
FIG. 8 is a signal waveform diagram showing the operation of the pulse modulation type electric power amplifier according to the fourth embodiment.

The operation of the pulse modulation type electric power amplifier of FIG. 7 is shown in FIG. 8. A, B, D and F show the waveforms of the corresponding signals in FIG. 7. When the clock A is operating normally, the pulse modulator 1 converts the analog input signal B to a pulse train. The output control circuit 20 operates logically the pulse modulator output C and outputs a pulse train. The output circuit 3 outputs a pulse train as an output signal D based on the pulse train from the output control circuit 20.

If stoppage of the clock A occurs, the clock detection circuit 31 detects the clock stoppage, and sends the output prohibition signal F to the output control circuit 20. The logic operation performed by the output control circuit 20 is thereby changed, resulting in the transistors of the output circuit 3 being turned OFF and voltage amplification being stopped.

In contrast, the following problems arise in a configuration that does not include the clock detection circuit 31. Firstly, if the clock A stops, the pulse modulator 1, being unable to convert the analog input signal B to a pulse train, outputs an indeterminate value. This signal is input to the output control circuit 20 and operated logically, resulting in the output control circuit 20 constantly outputting a high voltage or a low voltage. If a low voltage constantly is output, the PMOS transistor of the output circuit 3 is constantly ON, allowing current to flow continually from the power supply terminal 26 as the output signal D. Consequently, current continually flows to the load 5 as a result of the output signal D, causing overheating and failure.

Figure 9:
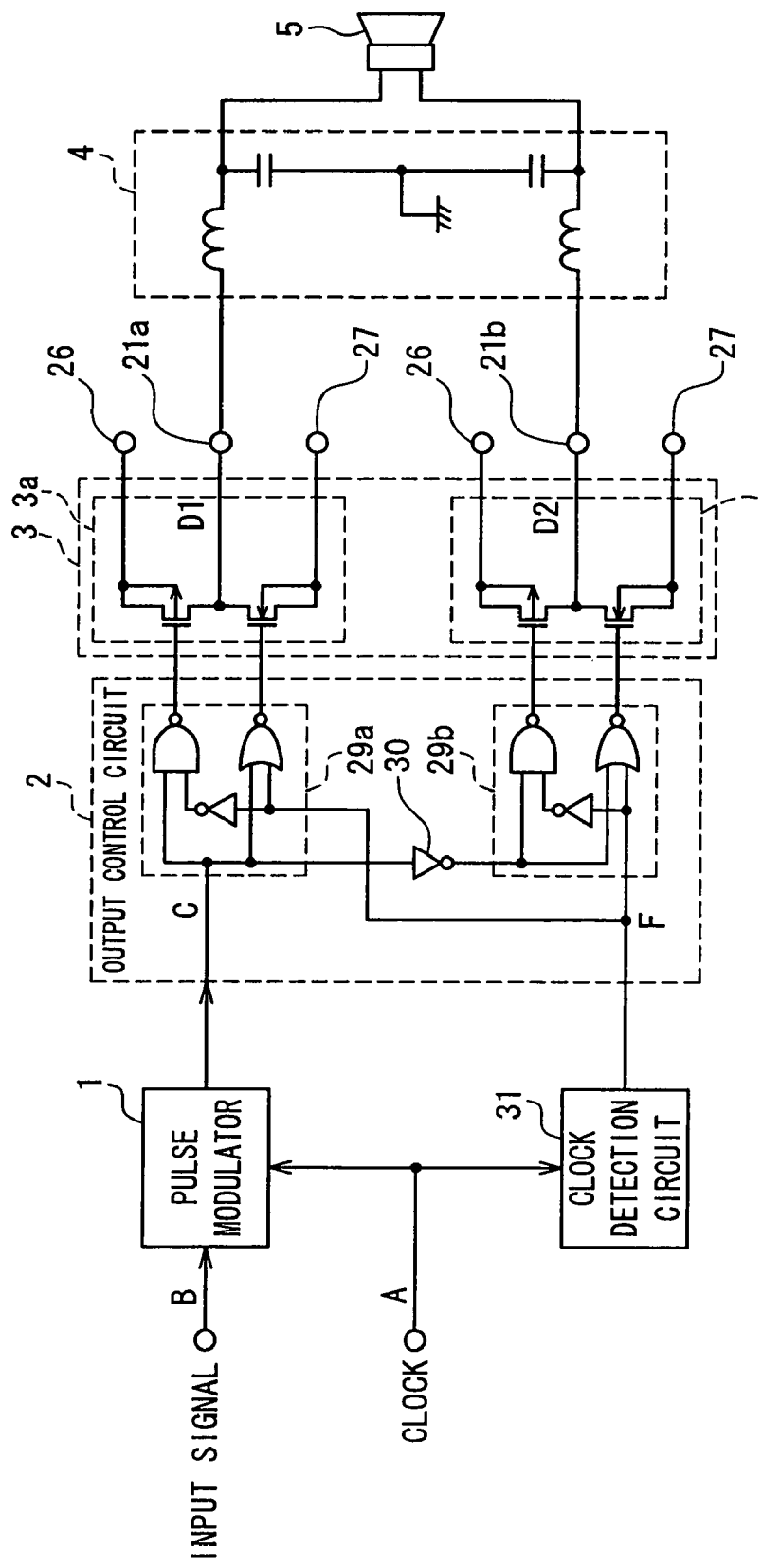
FIG. 9 is a block diagram of a pulse modulation type electric power amplifier in which the configuration of the fourth embodiment is applied to a BTL configuration.

Note that although a single output pulse modulation type electric power amplifier is given as an example in the above description, it is also possible, as shown in FIG. 9, for the present embodiment to be applied to a BTL pulse modulation type electric power amplifier similar to that shown in FIG. 5. That is, the first and second output circuits 3a and 3b having a bridge configuration are provided and respectively controlled by the first and second output control circuits 29a and 29b. The first output control circuit 29a receives as input the output prohibition signal F output from the clock detection circuit 31 and the pulse modulator output C, while the second output control circuit 29b receives as input the output prohibition signal F and a signal obtained by inverting the pulse modulator output C.

FIFTH EMBODIMENT

Figure 10:
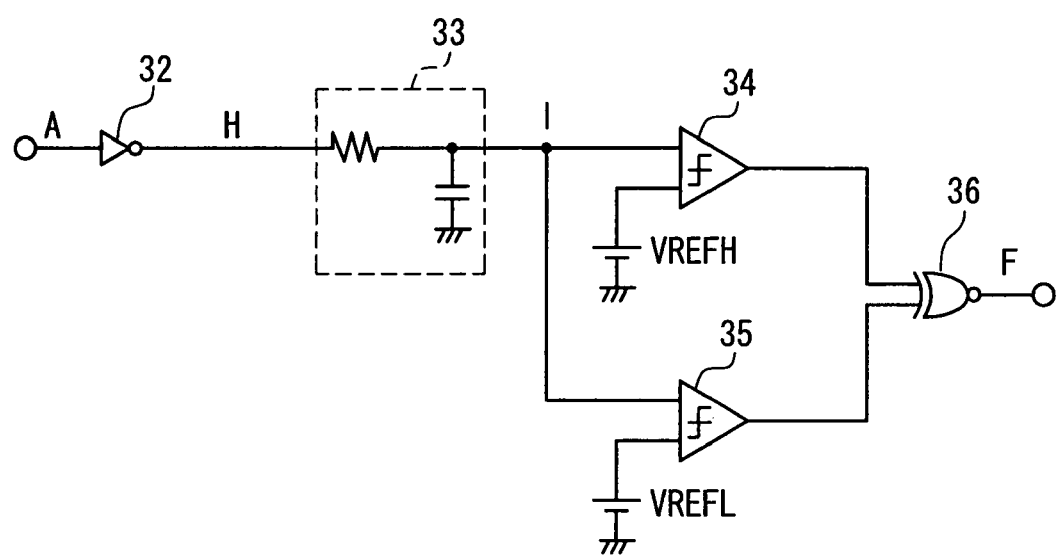
FIG. 10 is a circuit diagram of a clock detection circuit according to a fifth embodiment.

A clock detection circuit according a fifth embodiment of the present invention will be described with reference to the drawings. FIG. 10 is a circuit diagram showing the configuration of the clock detection circuit 31 constituting the pulse modulation type electric power amplifier shown in FIG. 7 or 9 according to the present embodiment.

The clock detection circuit according to the present embodiment is composed of an inverter 32 that receives as input the clock A, an integrator 33 that receives as input the inverter output H, a first comparator 34 that compares the integrator output I with a reference voltage VREFH, a second comparator 35 that compares the integrator output I with a reference voltage VREFL, and an EXNOR gate 36 that receives as input the outputs of the first and second comparators 34 and 35. The integrator 33 is constituted of a low pass filter whose cutoff frequency (f=½πCR) is sufficiently smaller than the frequency of the clock A.

The operation of this clock detection circuit will be described with reference also to the waveform diagram of FIG. 11. The clock A is input to the inverter 32, and the voltage is averaged by passing the output signal H of the inverter 32 through the integrator 33. The output signal I of the integrator 33 is input to the comparator 34, whose reference voltage is VREFH, and the comparator 35, whose reference voltage is VREFL. The outputs of the two comparators 34 and 35 are input to the EXNOR circuit 36. The EXNOR circuit 36 outputs a low voltage if the two comparator outputs differ and a high voltage if the two comparator outputs are equal.

Figure 11:
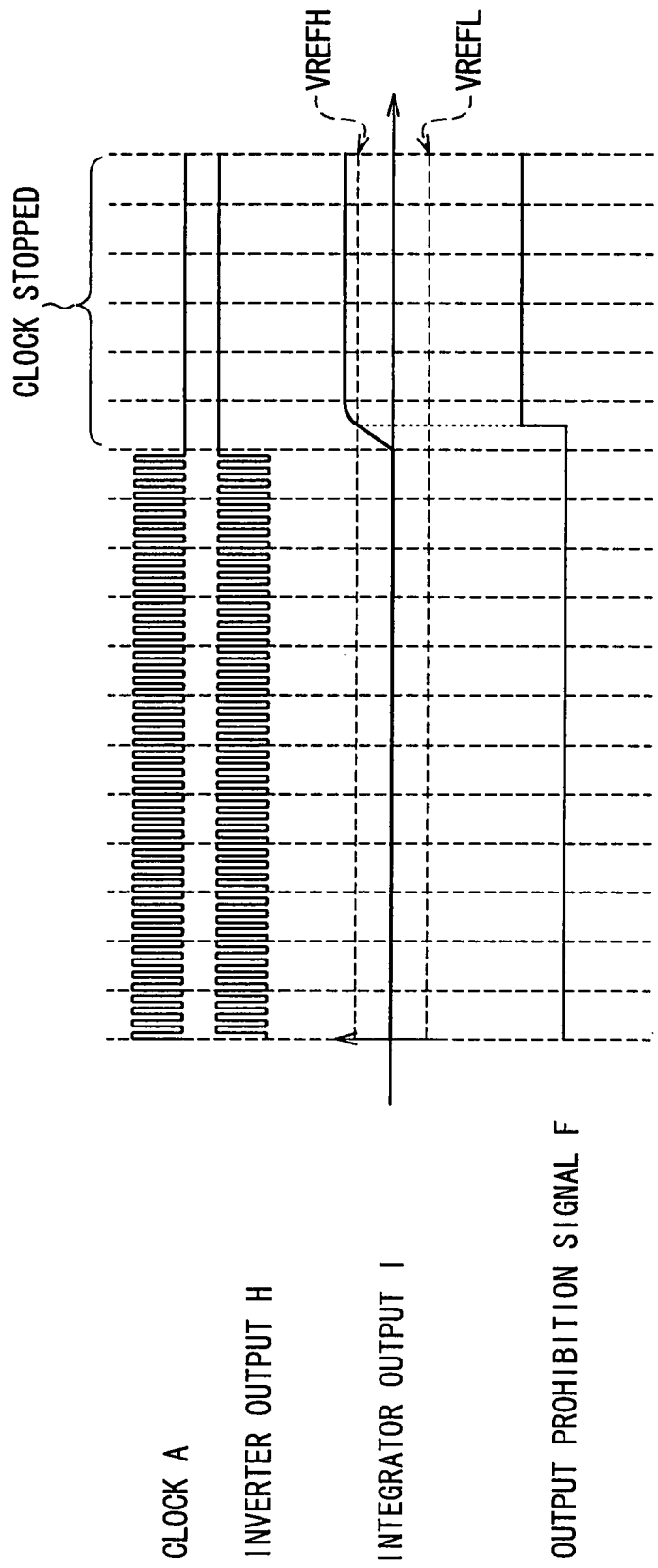
FIG. 11 is a signal waveform diagram showing the operation of the clock detection circuit.

When the clock A is operating normally, the signal I is a voltage smaller than VREFH and larger than VREFL, as shown prior to the clock stoppage in FIG. 11. Consequently, the comparator 34 outputs a low voltage since the input I is smaller than the reference voltage VREFH, and the comparator 35 outputs a high voltage since the input I is larger than the reference voltage VREFL. Thus, the EXNOR circuit 36 outputs a low voltage since the two comparator outputs differ.

When the clock A has stopped and output is stuck on high voltage, the signal voltage I after passing through the integrator 33 is greater than VREFH, as shown in FIG. 11. On the other hand, when the clock A has stopped and output is stuck on low voltage, the signal voltage I after passing through the integrator 33 is less than VREFL. That is, the voltage input to both comparators 34 and 35 is either greater than or less than the reference voltages. The outputs of the two comparators 34 and 35 are thus equal, and the EXNOR circuit 36, which receives as input the outputs of the two comparators 34 and 35, outputs a high voltage. The clock A thereby is determined to have stopped, and the output of the EXNOR circuit 36 is transmitted to the output control circuit 20 of FIG. 7 as the output prohibition signal F.

SIXTH EMBODIMENT

Figure 12:
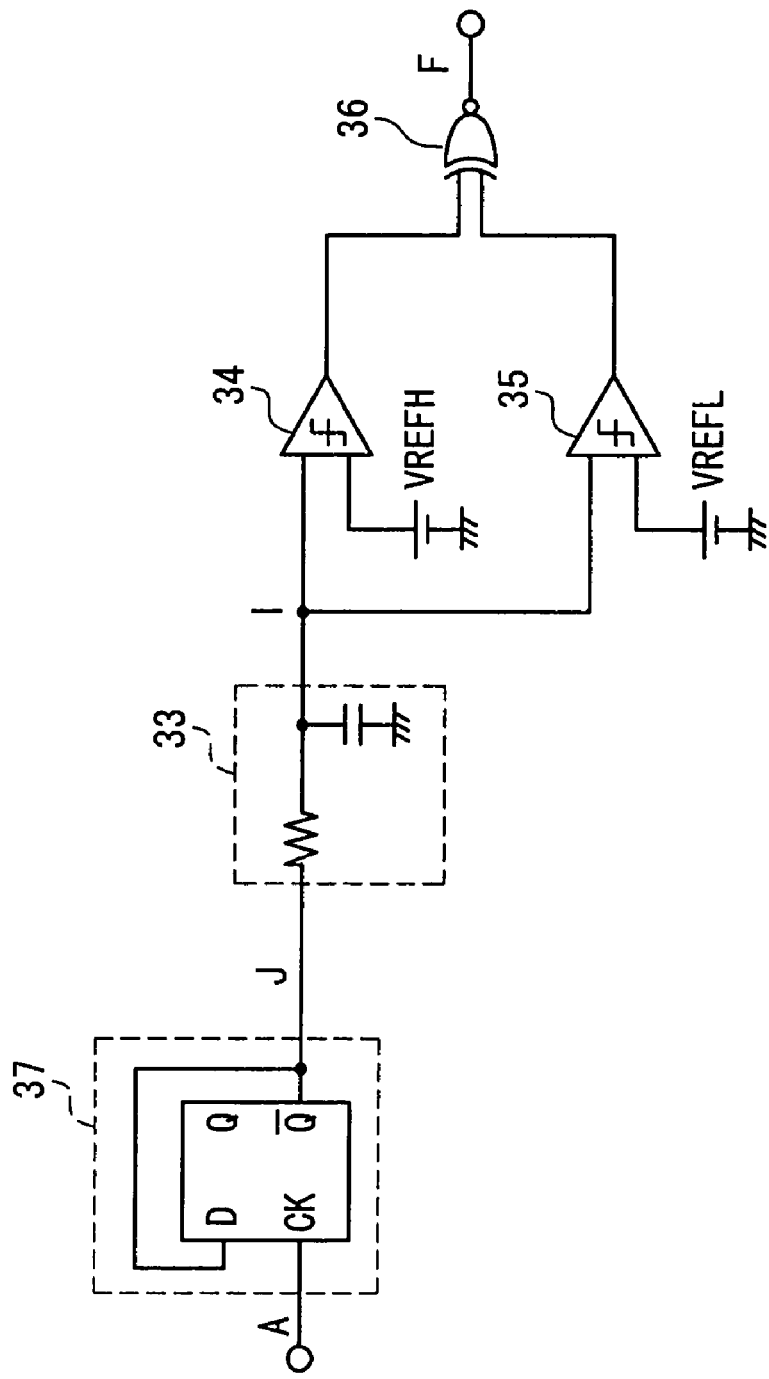
FIG. 12 is a circuit diagram of a clock detection circuit according to a sixth embodiment.

A clock detection circuit according a sixth embodiment of the present invention will be described with reference to the drawings. FIG. 12 is a circuit diagram showing the configuration of the clock detection circuit 31 constituting the pulse modulation type electric power amplifier shown in FIG. 7 or 9 according to the present embodiment.

The clock detection circuit according to the present embodiment is composed of a frequency divider 37 that receives as input the clock A, the integrator 33 that receives as input the frequency divider output J, the first comparator 34 that compares the output I of the integrator 33 with the reference voltage VREFH, the second comparator 35 that compares the integrator output I with the reference voltage VREFL, and the EXNOR gate 36.

Figure 13:
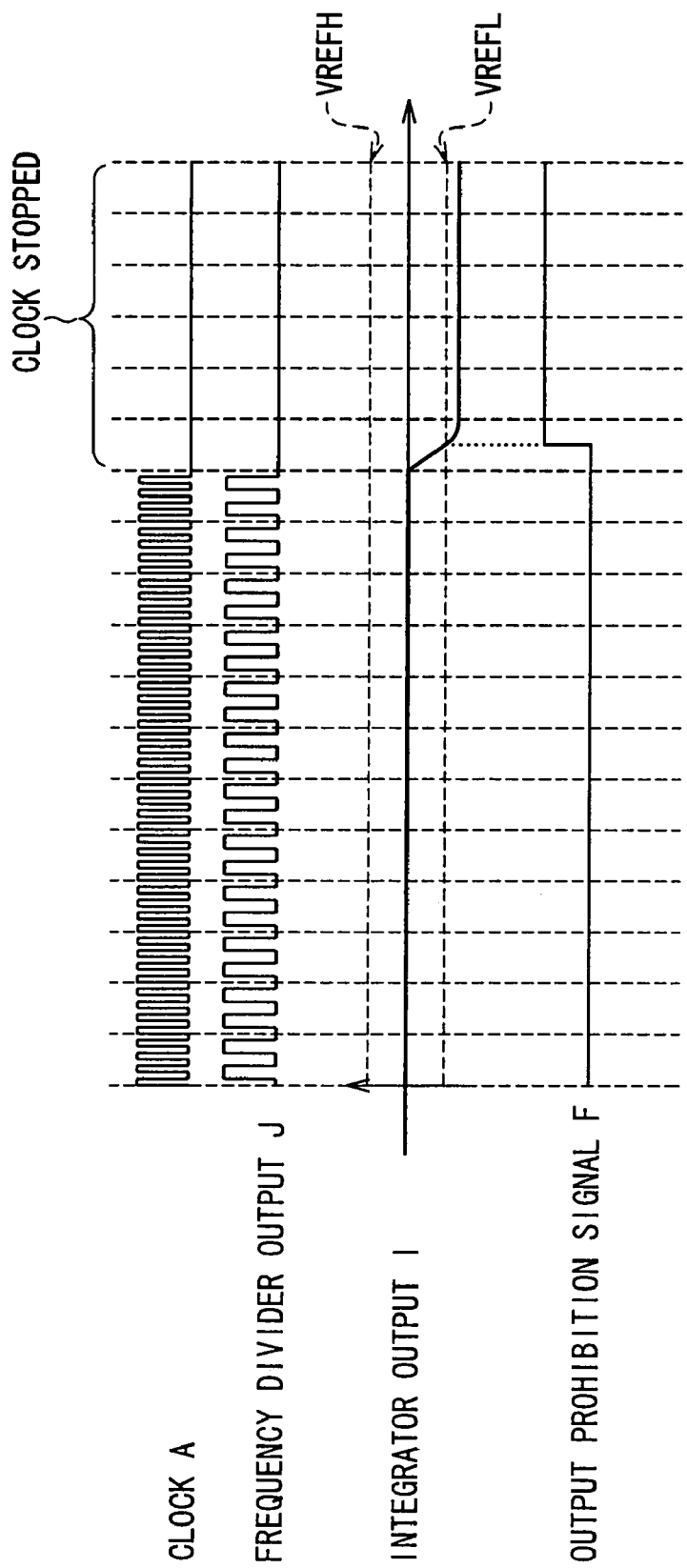
FIG. 13 is a signal waveform diagram showing the operation of the clock detection circuit.

The operation of this clock detection circuit will be described with reference also to the waveform diagram of FIG. 13. The clock A is input to the frequency divider 37, and the voltage is averaged by passing the output signal J of the frequency divider 37 through the integrator 33. The signal I of the integrator 33 is input to the comparator 34, whose reference voltage is VREFH, and the comparator 35, whose reference voltage is VREFL. The outputs of the two comparators are input to the EXNOR circuit 36, with the output of the EXNOR circuit 36 being a low voltage if the two comparator outputs differ and a high voltage if the two comparator outputs are equal.

When the clock A is operating normally, the signal J that passes through the frequency divider 37 will have a duty ratio of 50%. Therefore, when the voltage is averaged by the integrator 33, the signal I takes an intermediate value of the clock amplitude, being a voltage smaller than VREFH and greater than VREFL. Consequently, the comparator 34 outputs a low voltage since the input signal I is smaller than the reference value VREFH, and the comparator 35 outputs a high voltage since the input signal I is larger than the reference voltage VREFL. The EXNOR circuit 36 thus outputs a low voltage since the two comparator outputs differ.

When the clock A has stopped and output is stuck on high voltage, the signal voltage I after passing through the integrator 33 is greater than VREFH, and when the clock A has stopped and output is stuck on low voltage, the signal voltage I after passing through the integrator 33 is less than VREFL. That is, the voltage input to both comparators 34 and 35 is either greater than or less than the reference voltages. The outputs of the two comparators 34 and 35 are thus equal, and the EXNOR circuit 36, which receives as input the outputs of the comparators 34 and 35, outputs a high voltage. The clock thereby is determined to have stopped, and the output of the EXNOR circuit 36 is transmitted to the output control circuit 20 of FIG. 7 as the output prohibition signal F.

Note that while the block that converts the input signal to a pulse train is described above as a pulse modulator, this block can be a PWM modulator, PDM modulator, a delta-sigma modulator, or the like.

Also, in the above clock detection circuit, the comparators output a high voltage if the output I of the integrator 33 is greater than a reference value and output a low voltage if less than a reference value. However, the input/output relation of one of the comparators may be inverted, and the EXNOR gate may be replaced by an EXOR gate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A pulse modulation type electric power amplifier comprising:
    a pulse modulator that receives as input a clock and an input signal, and converts the input signal to a pulse train;
    an output control circuit that receives as input the pulse train output by the pulse modulator, and controls output of the pulse train;
    an output circuit that performs switching according to the pulse train output by the output control circuit;
    a digital converter that converts an output terminal voltage of the output circuit to a high or a low digital value;
    a short-circuit determination circuit that determines whether an output short circuit has occurred based on a state of an output signal of the digital converter, and outputs an output prohibition signal to the output control circuit when an output short circuit is detected; and
    a counter that measures, based on the clock, the time period during which the short-circuit determination circuit determines that an output short circuit has occurred,
    wherein the output control circuit controls output of the pulse train when the output prohibition signal is input, so that the output circuit stops the switching operation.

2. The pulse modulation type electric power amplifier according to claim 1, wherein the short-circuit determination circuit determines that an output short circuit has occurred if the output signal of the digital converter does not change within a set time period.

3. The pulse modulation type electric power amplifier according to claim 1, wherein the short-circuit determination circuit compares the output signal of the digital converter with a signal output from the pulse modulator, and determines that an output short circuit has occurred if the output signal of the digital converter does not match the signal output from the pulse modulator.

4. The pulse modulation type electric power amplifier according to claim 1, wherein the output circuit comprises a first switching element connected between an output terminal and a power supply terminal and a second switching element connected between the output terminal and a ground terminal, and separately stops a switching operation of the first switching element and the second switching element according to the output prohibition signal.

5. A pulse modulation type electric power amplifier comprising:
    a pulse modulator that receives as input a clock and an input signal, and converts the input signal to a pulse train;
    an output control circuit that receives as input the pulse train output by the pulse modulator, and controls output of the pulse train;
    an output circuit that performs switching according to the pulse train output by the output control circuit;
    a digital converter that converts an output terminal voltage of the output circuit to a high or a low digital value;
    a short-circuit determination circuit that determines whether an output short circuit has occurred based on a state of an output signal of the digital converter, and outputs an output prohibition signal to the output control circuit when an output short circuit is detected;
    wherein the output control circuit controls output of the pulse train when the output prohibition signal is input, so that the output circuit stops the switching operation,
    the output control circuit comprises a first output control circuit that receives as input the output of the short-circuit determination circuit and the output of the pulse modulator, and a second output control circuit that receives as input the output of the short-circuit determination circuit and a signal obtained by inverting the output of the pulse modulator,
    the output circuit comprises a first output circuit comprising a first switching element connected between a first output terminal and a power supply terminal and a second switching element connected between the first output terminal and a ground terminal, and a second output circuit comprising a third switching element connected between a second output terminal and the power supply terminal and a fourth switching element connected between the second output terminal and the ground terminal, and constitutes a bridge circuit in which the first and second switching element pair and the third and fourth switching element pair are alternately turned ON/OFF to switch a direction of current flowing between the first and second output terminals, as a result of the first and second switching elements performing switching in accordance with a pulse train output from the first output control circuit and the third and fourth switching elements performing switching in accordance with a pulse train output from the second output control circuit,
    the digital converter comprises a first digital converter that converts a voltage of the first output terminal to a high or a low digital value, and a second digital converter that converts a voltage of the second output terminal to a high or a low digital value, and the short-circuit determination circuit determines whether a short circuit has occurred between the first and second output terminals based on an output signal of the first and second digital converters.

6. The pulse modulation type electric power amplifier according to claim 5, further comprising a detector that detects that the output of the first comparator and the output of the second comparator are not inverted signals, wherein the short-circuit determination circuit determines that the first and second output terminals have short circuited if the detector continuously detects the non-inverted signal state for a set time period or longer.

7. The pulse modulation type electric power amplifier according to claim 2, wherein the set time period used by the short-circuit determination circuit for determining whether a short circuit has occurred is measured based on the clock.

8. The pulse modulation type electric power amplifier according to claim 6, wherein the set time period used by the short-circuit determination circuit for determining whether a short circuit has occurred is measured based on the clock.

9. The pulse modulation type electric power amplifier according to claim 1, wherein the digital converter comprises an inverter.

10. A pulse modulation type electric power amplifier comprising:

a pulse modulator that receives as input a clock and an input signal, and converts the input signal to a pulse train;

an output control circuit that receives as input the pulse train output by the pulse modulator, and controls output of the pulse train;

an output circuit that performs switching according to the pulse train output by the output control circuit;

a digital converter that converts an output terminal voltage of the output circuit to a high or a low digital value; and a short-circuit determination circuit that determines whether an output short circuit has occurred based on a state of an output signal of the digital converter, and outputs an output prohibition signal to the output control circuit when an output short circuit is detected;

wherein the output control circuit controls output of the pulse train when the output prohibition signal is input, so that the output circuit stops the switching operation, wherein the digital converter comprises a hysteresis inverter whose threshold differs when changing from high to low and from low to high.

11. The pulse modulation type electric power amplifier according to claim 1, wherein the pulse modulator outputs one of a pulse width modulated pulse train, a pulse density modulated pulse train, and a delta-sigma modulated pulse train.

12. The pulse modulation type electric power amplifier according to claim 11, wherein a signal output from the output circuit is an audio signal.

* * * * *